(12) United States Patent
Suzuki et al.

(10) Patent No.: US 8,860,473 B2
(45) Date of Patent: Oct. 14, 2014

(54) RINGING SUPPRESSION CIRCUIT

(71) Applicants: DENSO Corporation, Kariya (JP); Nippon Soken, Inc., Nishio (JP)

(72) Inventors: Youichirou Suzuki, Nishio (JP); Noboru Maeda, Chiryu (JP); Hiroyuki Obata, Nukata-gun (JP); Masakiyo Horie, Gamagori (JP); Tomohisa Kishigami, Obu (JP)

(73) Assignees: DENSO CORPORATION, Kariya (JP); Nippon Soken, Inc., Nishio (JP)

( * ) Notice: Subject to any disclaimer, the term of this patent is extended or adjusted under 35 U.S.C. 154(b) by 135 days.

(21) Appl. No.: 13/712,260

(22) Filed: Dec. 12, 2012

(65) Prior Publication Data

US 2013/0099849 A1 Apr. 25, 2013

Related U.S. Application Data

(62) Division of application No. 13/004,916, filed on Jan. 12, 2011, now Pat. No. 8,427,220.

(30) Foreign Application Priority Data

Jan. 14, 2010 (JP) ..................... 2010-5894

(51) Int. Cl.
*H03B 1/00* (2006.01)
*H04L 25/02* (2006.01)
*H03K 17/16* (2006.01)
*H03K 19/003* (2006.01)

(52) U.S. Cl.
CPC .............. *H03K 17/16* (2013.01); *H04L 25/028* (2013.01); *H03K 19/00361* (2013.01)

USPC ........................................................ 327/112

(58) Field of Classification Search
USPC .................. 327/108–112, 170, 389, 391; 326/22–27, 82, 83; 365/230.06
See application file for complete search history.

(56) References Cited

U.S. PATENT DOCUMENTS

| 6,191,573 B1 * | 2/2001 | Noda ................... 324/762.01 |
| 7,595,661 B2 | 9/2009 | Kim |
| 2006/0066358 A1 | 3/2006 | Tamai |
| 2006/0154709 A1 | 7/2006 | Takamuku |

FOREIGN PATENT DOCUMENTS

JP 2006-060505 A 3/2006

\* cited by examiner

*Primary Examiner* — Sibin Chen
(74) *Attorney, Agent, or Firm* — Posz Law Group, PLC

(57) ABSTRACT

A ringing suppression circuit for a communication circuit that performs communication through a transmission line includes a high side switch connected between a high potential reference point and a high side line of the transmission line, a low side switch connected between a low potential reference point and a low side line of the transmission line, and a ringing suppression section. The ringing suppression section turns on the high side switch based on a difference between a potential of the high side line and a potential applied to a control terminal of the high side switch. The ringing suppression section turns on the low side switch based on a difference between a potential of the low side line and a potential applied to a control terminal of the low side switch.

8 Claims, 9 Drawing Sheets

RINGING SUPPRESSION CIRCUIT

CROSS REFERENCE TO RELATED APPLICATIONS

This application is a divisional of U.S. patent application Ser. No. 13/004,916 filed on Jan. 12, 2011 and entitled RINGING SUPPRESSION CIRCUIT, and is based on and incorporates herein by reference Japanese Patent Application No. 2010-5894 filed on Jan. 14, 2010.

FIELD OF THE INVENTION

The present invention relates to a ringing suppression circuit for a communication circuit that performs communication by transmitting a differential signal through a transmission line.

BACKGROUND OF THE INVENTION

In a controller area network (CAN), which is a kind of in-vehicle communication network, a differential signal is transmitted through a bus consisting of a pair of signal lines by applying a voltage between the signal lines so that the bus can be in a dominant level. The signal lines of the bus are generally called the "CAN_High" and the "CAN_low". When the bus is not in the dominant level, the signal lines are at the same potential so that the bus can be in a recessive level.

In such a communication network, when the bus changes between the recessive level and the dominant level, ringing (i.e., overshoot and undershoot) in a signal waveform occurs. For example, when the bus changes from the dominant level to the recessive level, undershoot may occur due to the energy of electric current stored in an inductance of the bus.

In a technique disclosed in US 2006/0066358 A1 corresponding to JP 2006-101430 A, when undershoot occurs, a freewheel diode connected between signal lines of a bus is turned on to reduce the undershoot.

The technique disclosed in US 2006/0066358 A1 has the following disadvantages. When the freewheel diode is a PN junction diode having an on-voltage of about 0.8V, the freewheel diode cannot be turned on unless the undershoot exceeds 0.8V. Since a Schottky diode has an on-voltage of about 0.3V, the Schottky diode may be used as the freewheel diode. However, the use of the Schottky diode as the freewheel diode results in an increase in leak current and a decrease in resistance to voltage breakdown.

SUMMARY OF THE INVENTION

In view of the above, it is an object of the present invention to provide a ringing suppression circuit for reducing lower undershoot.

According to an aspect of the present invention, a ringing suppression circuit for a communication circuit that is connected to a transmission line having a pair of high and low potential side signal lines to perform communication by transmitting a differential signal through the transmission line includes a high potential side switching element, a low potential side switching element, and a ringing suppression section. The high potential side switching element is connected between a predetermined high potential reference point and the high potential side signal line. The low potential side switching element is connected between a predetermined low potential reference point and the low potential side signal line. The ringing suppression section turns on the high potential side switching element based on a difference between a potential of the high potential side signal line and a potential applied to a control terminal of the high potential side switching element. The ringing suppression section turns on the low potential side switching element based on a difference between a potential of the low potential side signal line and a potential applied to a control terminal of the low potential side switching element.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

A first embodiment of the present invention is described below with reference to FIGS. 1-4. FIG. 2 illustrates a differential communication network 1. In the network 1, nodes 2 mounted on a vehicle are bus-connected in parallel through a transmission line 3 constructed with a twisted pair cable to control communication between the nodes 2. Example of the nodes 2 can include a sensor for detecting a vehicle condition and a controller, such as an electronic control unit (ECU), for controlling an actuator based on a detection signal from the sensor. Each node 2 has a communication circuit for converting transmission data and reception data into a communication signal according to a communication protocol on the transmission line 3. Thus, one node 2 can communicate with another node 2. A hub 4 can be placed in the middle of the transmission line 3 as necessary to divide the transmission line 3.

Figure 1:
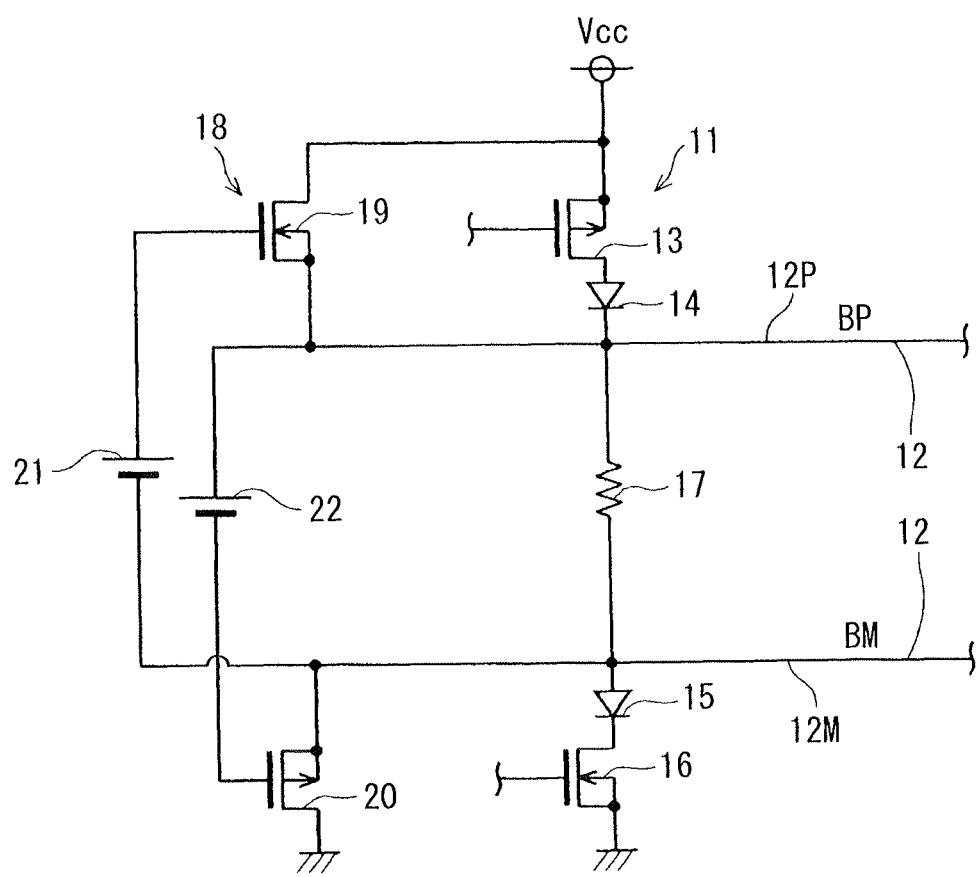
FIG. 1 is a diagram illustrating a ringing suppression circuit according to a first embodiment of the present invention.
Figure 2:
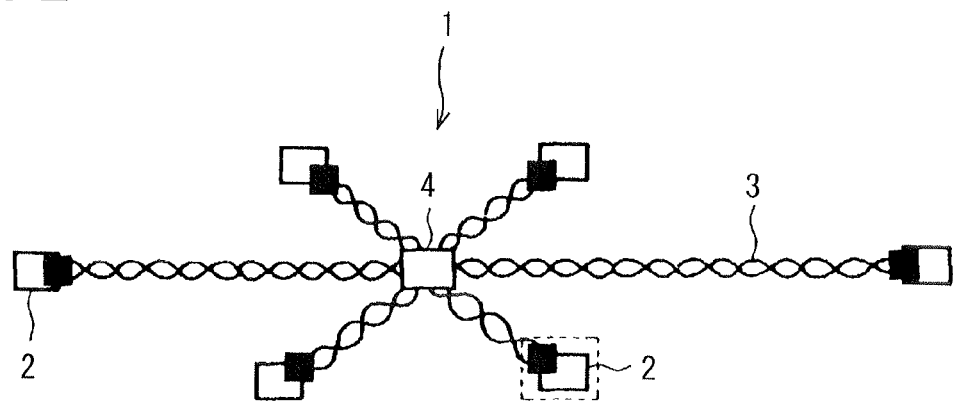
FIG. 2 is a diagram illustrating a differential communication network in which a node provided with the ringing suppression circuit is connected.

FIG. 1 illustrates a ringing suppression circuit (RSC) 18 included in the node 2. The node 2 includes a signal transmitter section and a signal receiver section. It is noted that FIG. 1 illustrates only a transmitter driver circuit 11 for the transmitter section. The transmitter driver circuit 11 includes a first series circuit of a P-channel metal-oxide-semiconductor field-effect transistor (MOSFET) 13 and a diode 14. The first series circuit is connected between a power supply Vcc of 5V (as a high potential reference point) and a signal line 12P (as a high potential side signal line) of a transmission line 12. The transmitter driver circuit 11 further includes a second series circuit of a diode 15 and an N-channel MOSFET 16. The second series circuit is connected between a signal line 12M (as a low potential side signal line) of the transmission line 12 and a ground (as a low potential reference point). A resistor 17 is connected between the signal lines 12P, 12M.

The ringing suppression circuit 18 includes an N-channel MOSFET (as a high potential side switching element) 19 and a P-channel MOSFET (as a low potential side switching element) 20. A drain of the MOSFET 19 is connected to the power supply Vcc, and a source of the MOSFET 19 is connected to the signal line 12P. A source of the MOSFET 20 is connected to the signal line 12M, and a drain of the MOSFET 20 is connected to the ground. A gate of the MOSFET 19 is connected to the signal line 12M through a reference voltage source 21 (as a first potential adjuster circuit). A gate of the MOSFET 20 is connected to the signal line 12P through a reference voltage source 22 (as a second potential adjuster circuit). A reference voltage of the reference voltage source 21 can be equivalent to a threshold voltage (i.e., turn-on voltage) of the MOSFET 19 and range from about 0.5 volts (V) to about 0.6V, for example. A reference voltage of the reference voltage source 22 can be equivalent to a threshold voltage (i.e., turn-on voltage) of the MOSFET 20 and range from 0.5V to about 0.6V, for example.

Advantages of the first embodiment are described below. When both the MOSFET 13 and the MOSFET 16 of the transmitter driver circuit 11 are turned on, the transmission line 12 is driven to a dominant level in CAN. In this case, assuming that a forward voltage of each of the diodes 14, 15 is Vf, a voltage (i.e., a difference in potential) between the signal lines 12P, 12M is Vcc−2Vf. Then, when both the MOSFET 13 and the MOSFET 16 are turned off, the voltage between the signal lines 12P, 12M becomes zero so that the transmission line 12 can change to a recessive level. It is noted that a reference ground potential of each of the signal lines 12P, 12M is set to Vcc/2.

When both the MOSFET 13 and the MOSFET 16 are turned off to change the transmission line 12 to the recessive level, undershoot is likely to occur due to energy of an electric current flowing through the transmission line 12 in the dominant level. In this case, when a potential VBP of the signal line 12P becomes less than a potential VBM of the signal line 12M (i.e., VBP<VBM), a gate-to-source voltage of each of the MOSFET 19 and the MOSFET 20 exceeds its threshold voltage Vt so that the MOSFET 19 and the MOSFET 20 can be turned on at the same time. As a result, an electric current path from the signal line 12P to the power supply Vcc is created, and an electric current path from the signal line 12M to the ground is created. Thus, the undershoot can be suppressed. The same can hold for a receiver drive circuit for the receiver section.

Figure 3:
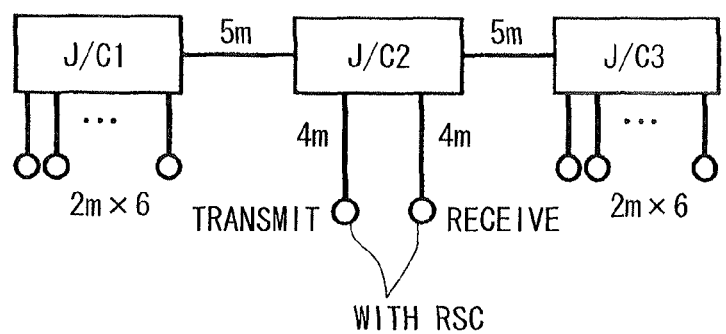
FIG. 3 is a diagram illustrating a communication network model used in a simulation conducted to evaluate operation of the ringing suppression circuit.
Figure 4:
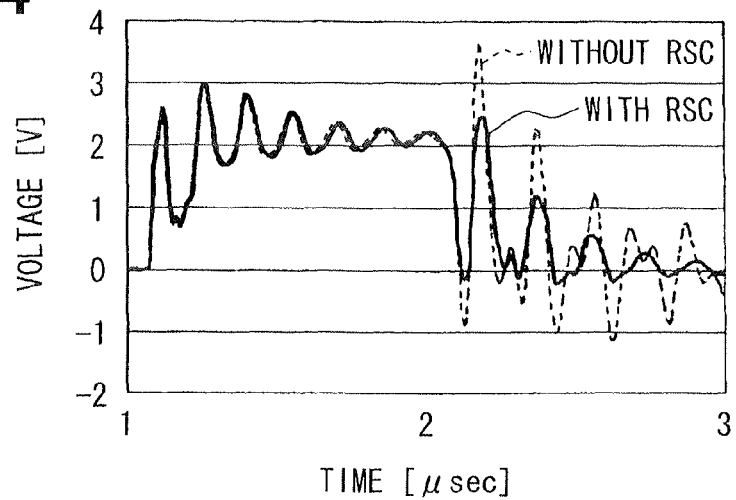
FIG. 4 is a diagram illustrating a result of the simulation.

FIG. 3 illustrates a communication network model used in a simulation conducted to evaluate operation of the ringing suppression circuit 18. FIG. 4 shows a result of the simulation. As shown in FIG. 3, in the communication network model used in the simulation, three junctions (i.e., hubs) J/C1-J/C3 are connected by a transmission line having a length of five meters (i.e. 5 m). Six nodes are connected to each of the junction J/C1 and the junction J/C3 by a transmission line having a length of 2 m. Two nodes are connected to the junction J/C2 by a transmission line having a length of 4 m. One of the nodes connected to the junction J/C2 is used as a transmitter node, and the other of the nodes connected to the junction J/C2 is used as a receiver node. Each of the transmitter node and the receiver node is provided with the ringing suppression circuit 18. A resistance of the resistor 17 of the ringing suppression circuit 18 is set to 37 kΩ corresponding to a line impedance. The nodes other than the transmitter node and the receiver node are configured as a parallel circuit of a resistor having a resistance of 33 kΩ and a capacitor having a capacitance of 90 pF, as a receiver circuit model. A differential termination resistor having a resistance of 120 kΩ is connected to each of the junction J/C1 and the junction J/C3.

FIG. 4 illustrates a waveform of a differential signal on the transmission line. In FIG. 4, a broken line represents a case where the node is provided with the ringing suppression circuit 18, and a solid line represents a case where the node is provided without the ringing suppression circuit 18. In the case where the node is provided without the ringing suppression circuit 18, the maximum undershoot level is about minus 1V (i.e., −1V), and the maximum overshoot level is about 3.6V. In the case where the node is provided with the ringing suppression circuit 18, the maximum undershoot level is about −0.2V, and the maximum overshoot level is about 2.5V. Thus, due to the ringing suppression circuit 18, the maximum undershoot level is reduced from −1V to −0.2V, and the maximum overshoot level is reduced from 3.6V to 2.5V.

As described above, according to the first embodiment, the ringing suppression circuit 18 includes the N-channel MOSFET 19 connected between the power supply Vcc and the signal line 12P and the P-channel MOSFET 20 connected between the signal line 12M and the ground. The ringing suppression circuit 18 turns on the MOSFET 19 based on a difference in potential between the signal line 12P and the gate of the MOSFET 19 and turns on the MOSFET 20 based on a difference in potential between the signal line 12M and the gate of the MOSFET 20. In such an approach, the ringing suppression circuit 18 can suppress ringing on the signal lines 12P, 12M. The undershoot level to be absorbed can be adjusted by adjusting initial potentials of the gates of the MOSFET 19 and the MOSFET 20. Therefore, unlike the technique disclosed in US 2006/0066358 A1, the ringing can be suppressed without using a freewheel diode.

Further, according to the first embodiment, the ringing suppression circuit 18 includes the reference voltage sources 21, 22. In such an approach, the MOSFET 19 and the MOSFET 20 can be turned on by adjusting the initial potentials of the gates of the MOSFET 19 and the MOSFET 20 using the reference voltage sources 21, 22, even when the undershoot level is less than the threshold voltages Vt of the MOSFET 19 and the MOSFET 20. Thus, the ringing can be suppressed.

Second Embodiment

Figure 5:
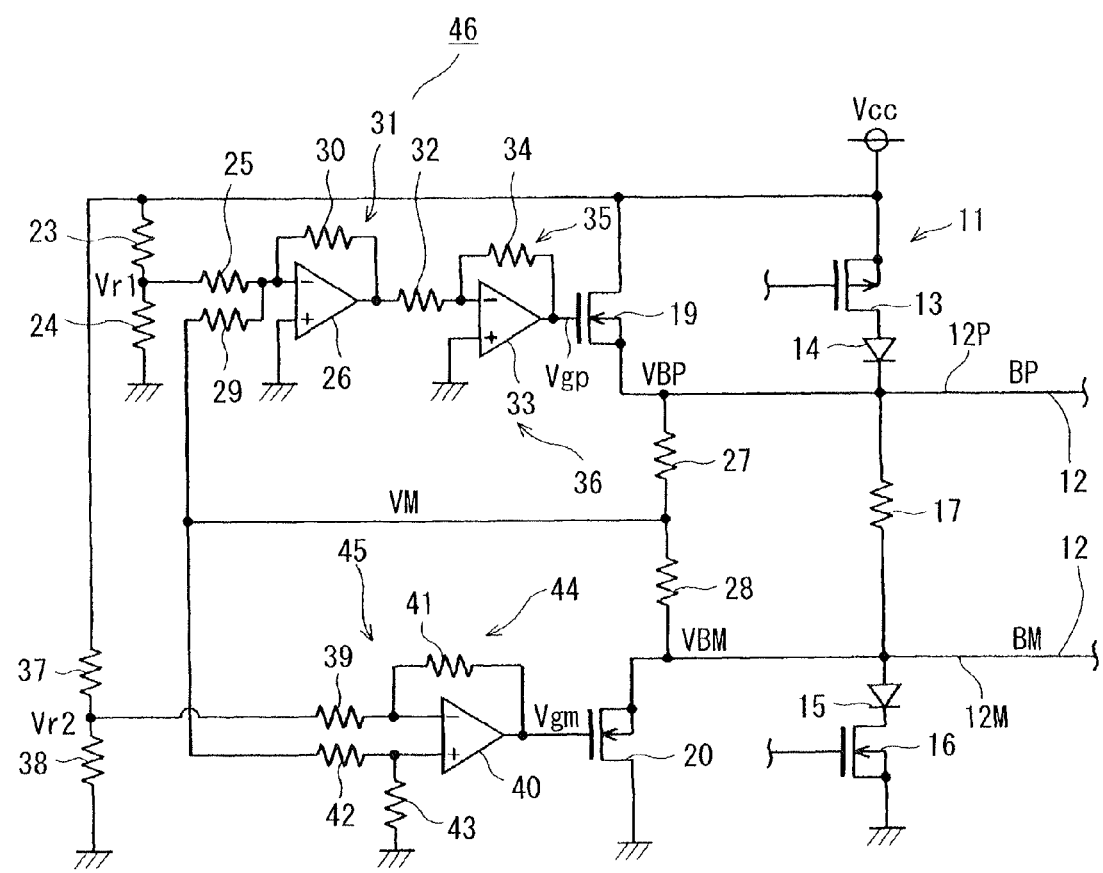
FIG. 5 is a diagram illustrating a ringing suppression circuit according to a second embodiment of the present invention.

A ringing suppression circuit 46 according to a second embodiment of the present invention is described below with reference to FIGS. 5 and 6. A difference between the first embodiment and the second embodiment is as follows. In the second embodiment, circuits corresponding to the reference voltage sources 21, 22 are described in details. A series circuit of resistors 23, 24 is connected between the power supply Vcc and the ground. A connection point between the resistors 23, 24 is connected through a resistor 25 to an inverting input terminal of an operational amplifier 26.

A series circuit (as a midpoint potential detection circuit) of resistors 27, 28 is connected between the source of the N-channel MOSFET 19 and the source of the P-channel MOSFET 20. A connection point between the resistors 27, 28 is connected through a resistor 29 to the inverting input terminal of the operational amplifier 26. It is noted that a resistance of the resistor 27 is equal to a resistance of the resistor 28 so that a potential at the connection point between the resistors 27, 28 can become a midpoint potential VM between the signal lines 12P, 12M. A non-inverting input terminal of the operational amplifier 26 is connected to the ground. The inverting input terminal and an output terminal of the operational amplifier 26 are connected together through a resistor 30. In this way, an adder circuit 31 is constructed mainly with the operational amplifier 26.

The output terminal of the operational amplifier 26 is connected through a resistor 32 to an inverting input terminal of a next operational amplifier 33. The inverting input terminal and an output terminal of the operational amplifier 33 are connected together through a resistor 34. A non-inverting input terminal of the operational amplifier 33 is connected to the ground. Thus, an inverting buffer circuit 35 is constructed mainly with the operational amplifier 33, and the output terminal of the operational amplifier 33 is connected to a gate of the N-channel MOSFET 19. In this way, a first potential adjuster circuit 36 is constructed.

On the signal line 12M side, a series circuit of resistors 37, 38 is connected between the power supply Vcc and the ground. A connection point between the resistors 37, 38 is connected through a resistor 39 to an inverting input terminal of an operational amplifier 40. The inverting input terminal and an output terminal of the operational amplifier 40 are connected together through a resistor 41. A non-inverting input terminal of the operational amplifier 40 is connected through a resistor 42 to the connection point between the resistors 27, 28. Further, the non-inverting input terminal of the operational amplifier 40 is connected through a resistor 43 to the ground. Thus, a subtraction circuit (differential circuit) 44 is constructed mainly with the operational amplifier 40. In this way, a second potential adjuster circuit 45 is constructed. The ringing suppression circuit 46 according to the second embodiment is constructed with the N-channel MOSFET 19, the P-channel MOSFET 20, the first potential adjuster circuit 36, and the second potential adjuster circuit 45.

Next, advantages of the second embodiment are described. In the description below, a potential of the connection point between the resistors 23, 24 is denoted as Vr1, and a potential of the connection point between the resistors 37, 38 is denoted as Vr2. In this case, a potential Vgp applied by the first potential adjuster circuit 36 to the gate of the MOSFET 19 is VM+Vr1, and a potential Vgm applied by the second potential adjuster circuit 45 to the gate of the MOSFET 20 is Vr2−VM.

When a potential VBP of the signal line 12P decreases such that Vgp−VBP>Vt, the MOSFET 19 is turned on so that the undershoot can be suppressed in the same way as in the first embodiment. When a potential VBM of the signal line 12M increases such that Vgm−VBM>−Vt, the MOSFET 20 is turned on so that the undershoot can be suppressed in the same way as in the first embodiment.

It is noted that the potential Vgp applied by the first potential adjuster circuit 36 to the gate of the MOSFET 19 and the potential Vgm applied by the second potential adjuster circuit 45 to the gate of the MOSFET 20 are generated based on the midpoint potential VM between the signal lines 12P, 12M. Therefore, the first potential adjuster circuit 36 and the second potential adjuster circuit 45 can be surely driven to reduce the ringing even under the condition that common mode noise is present on the transmission line 12.

Figure 6:
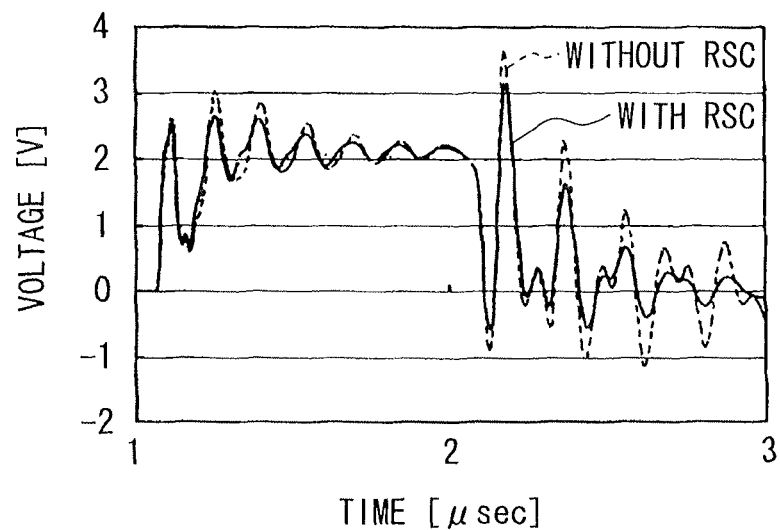
FIG. 6 is a diagram illustrating a result of a simulation conducted to evaluate operation of the ringing suppression circuit of FIG. 5 by using the communication network model of FIG. 3.

FIG. 6 shows a result of a simulation conducted to evaluate operation of the ringing suppression circuit 46 by using the communication network model illustrated in FIG. 4. In the case where the node is provided with the ringing suppression circuit 46, the maximum undershoot level is about −0.5V, and the maximum overshoot level is about 3.1V. Thus, due to the ringing suppression circuit 46, the maximum undershoot level is reduced from −1V to −0.5V, and the maximum overshoot level is reduced from 3.6V to 3.1V.

As described above, according to the second embodiment, the ringing suppression circuit 46 includes the N-channel MOSFET 19, the P-channel MOSFET 20, the first potential adjuster circuit 36, and the second potential adjuster circuit 45. The first potential adjuster circuit 36 generates the potential Vgp applied to the gate of the MOSFET 19 by adding a predetermined potential Vr1 and the midpoint potential VM between the signals lines 12P, 12M. The second potential adjuster circuit 45 generates the potential Vgm applied to the gate of the MOSFET 20 by subtracting the midpoint potential VM from a predetermined potential Vr2. Thus, the potential Vgp applied to the gate of the MOSFET 19 and the potential Vgm applied to the gate of the MOSFET 20 are generated based on the midpoint potential VM of the transmission line 12. Therefore, the undershoot can be surely suppressed even under the condition that common mode noise is present on the transmission line 12.

Third Embodiment

Figure 8:
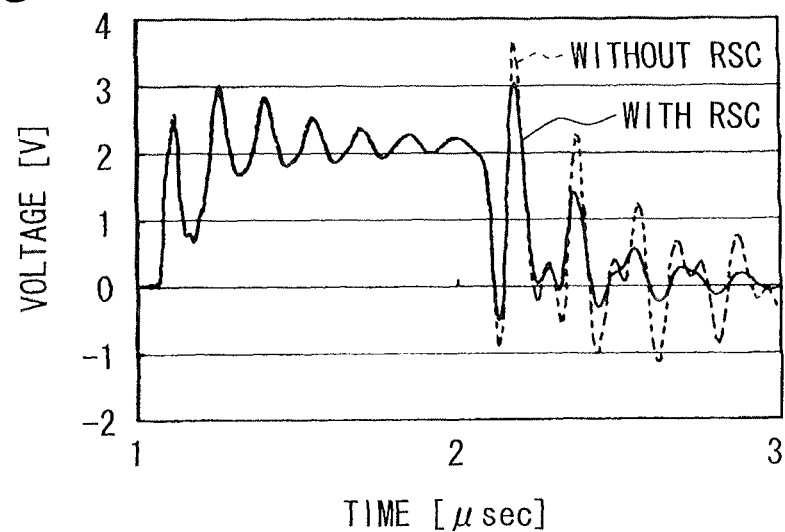
FIG. 8 is a diagram illustrating a result of a simulation conducted to evaluate operation of the ringing suppression circuit of FIG. 7 by using the communication network model of FIG. 3.
Figure 7:
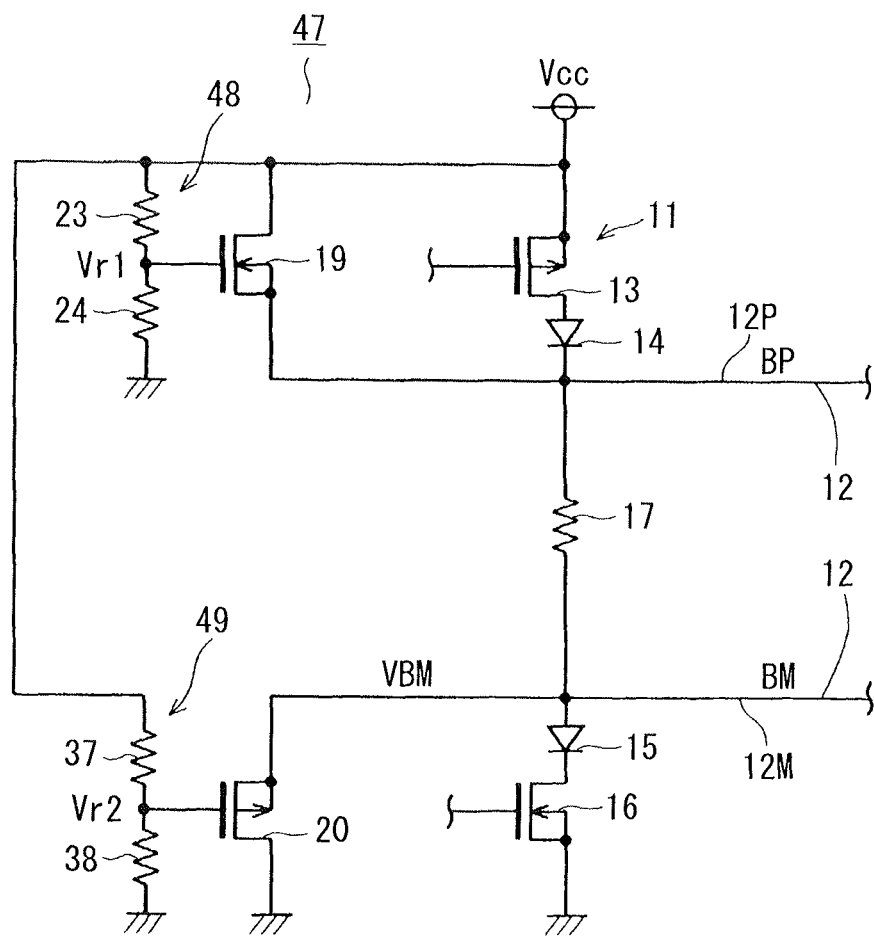
FIG. 7 is a diagram illustrating a ringing suppression circuit according to a third embodiment of the present invention.

A ringing suppression circuit 47 according to a third embodiment of the present invention is described below with reference to FIGS. 7 and 8. A difference between the second embodiment and the third embodiment is as follows. The adder circuit 31 and the inventing buffer circuit 35 are eliminated from the first potential adjuster circuit 36, and the connection point between the resistors 23, 24 is connected directly to the gate of the MOSFET 19. Further, the subtraction circuit 44 is eliminated from the second potential adjuster circuit 45, and the connection point between the resistors 37, 38 is connected directly to the gate of the MOSFET 20. Thus, the resistors 23, 24 form a first reference potential supply circuit 48, and the resistors 37, 38 form a second reference potential supply circuit 49. A potential of the connection point between the resistors 23, 24 is denoted as a first reference potential, and a potential of the connection point between the resistors 37, 38 is denoted as a second reference potential. The resistors 23, 24 can have the same resistance, and the resistors 37, 38 can have the same resistance.

Next, advantages of the third embodiment are described. The ringing suppression circuit 47 operates in the same manner as the ringing suppression circuit 46 of the second embodiment except that the potential applied to the gates of the MOSFETs 19, 20 are not based on the midpoint potential VM of the transmission line 12. FIG. 8 shows a result of a simulation conducted to evaluate operation of the ringing suppression circuit 47 by using the communication network model illustrated in FIG. 4. In the case where the node is provided with the ringing suppression circuit 47, the maximum undershoot level is about −0.5V, and the maximum overshoot level is about 3.0V. Thus, due to the ringing suppression circuit 47, the maximum undershoot level is reduced from −1V to −0.5V, and the maximum overshoot level is reduced from 3.6V to 3.0V.

As described above, according to the third embodiment, the ringing suppression circuit 47 includes the N-channel MOSFET 19, the P-channel MOSFET 20, the first reference potential supply circuit 48, and the second reference potential supply circuit 49. The first reference potential supply circuit 48 applies the first reference potential to the gate of the MOSFET 19. Therefore, the MOSFET 19 is turned on, when a difference between the first reference potential and the potential of the signal line 12P exceeds the threshold voltage Vt of the MOSFET 19. The second reference potential supply circuit 49 applies the second reference potential to the gate of the MOSFET 20. Therefore, the MOSFET 20 is turned on, when a difference between the second reference potential and the potential of the signal line 12M exceeds the threshold voltage Vt of the MOSFET 20. Thus, how much the undershoot is suppressed can be determined by adjusting the first and second reference potentials.

Fourth Embodiment

Figure 9:
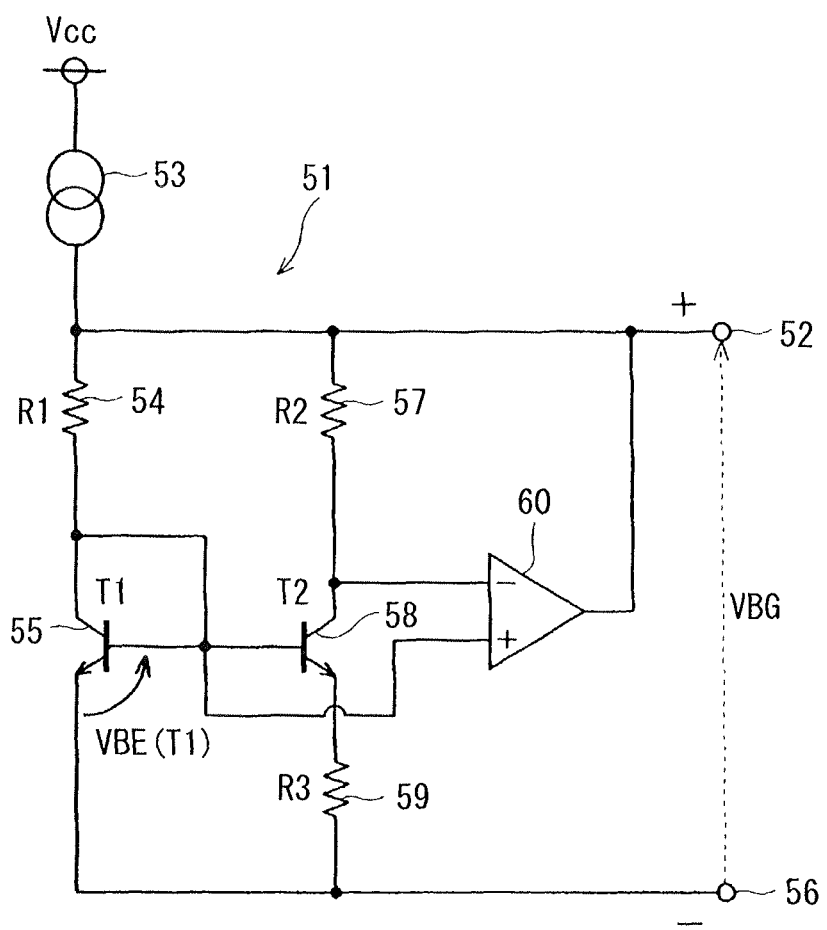
FIG. 9 is a diagram illustrating a bandgap reference circuit of a ringing suppression circuit according to a fourth embodiment of the present invention.

A fourth embodiment of the present invention is described below with reference to FIG. 9. According to the fourth embodiment, the first and second reference voltage sources 21, 22 of the first embodiment are implemented by a bandgap reference circuit 51. A positive terminal 52 of the bandgap reference circuit 51 is connected to the power supply Vcc through a current source 53. Further, the positive terminal 52 of the bandgap reference circuit 51 is connected to a negative terminal 56 of the bandgap reference circuit 51 through a series circuit of a resistor 54 and an NPN transistor 55. Furthermore, the positive terminal 52 of the bandgap reference circuit 51 is connected to the negative terminal 56 of the bandgap reference circuit 51 through another series circuit of a resistor 57, an NPN transistor 58, and a resistor 59.

Bases of the NPN transistors 55, 58 are connected to a collector of the NPN transistor 55 so that the NPN transistors 55, 58 can form a current mirror. Further, the bases of the NPN transistors 55, 58 are connected to a non-inverting input terminal of the operational amplifier 60. A collector of the NPN transistor 58 is connected to an inverting input terminal of the operational amplifier 60. An output terminal of the operational amplifier 60 is connected to the positive terminal 52 of the bandgap reference circuit 51 so that an output voltage VBG of the operational amplifier 60 can be applied between the positive terminal 52 and the negative terminal 56 of the bandgap reference circuit 51. The output voltage VBG is given by the following equation:

$$VBG = VBE(T1) + (kT/q)(R2/R3)\ln(R2/R1)$$

In the above equation, VBE(T1) represents a base-emitter voltage of the NPN transistor 55, R1-R3 represent resistances of the resistors 54, 57, 59, respectively, k represents Boltzmann's constant, q represents electron's charge, and T represents absolute temperature.

When the first reference voltage source 21 is implemented by the bandgap reference circuit 51, the positive terminal 52 is connected to the gate of the MOSFET 19, and the negative terminal 56 is connected to the signal line 12M side. When the second reference voltage source 22 is implemented by the bandgap reference circuit 51, the positive terminal 52 is connected to the signal line 12P side, and the negative terminal 56 is connected to the gate of the MOSFET 20.

As described above, according to the fourth embodiment, the first and second reference voltage sources 21, 22 are implemented by using the bandgap reference circuit 51. In such an approach, stable potentials can be applied to the gates of the MOSFETs 19, 20 even under the condition that the ambient temperature is likely to change.

Fifth Embodiment

Figure 10:
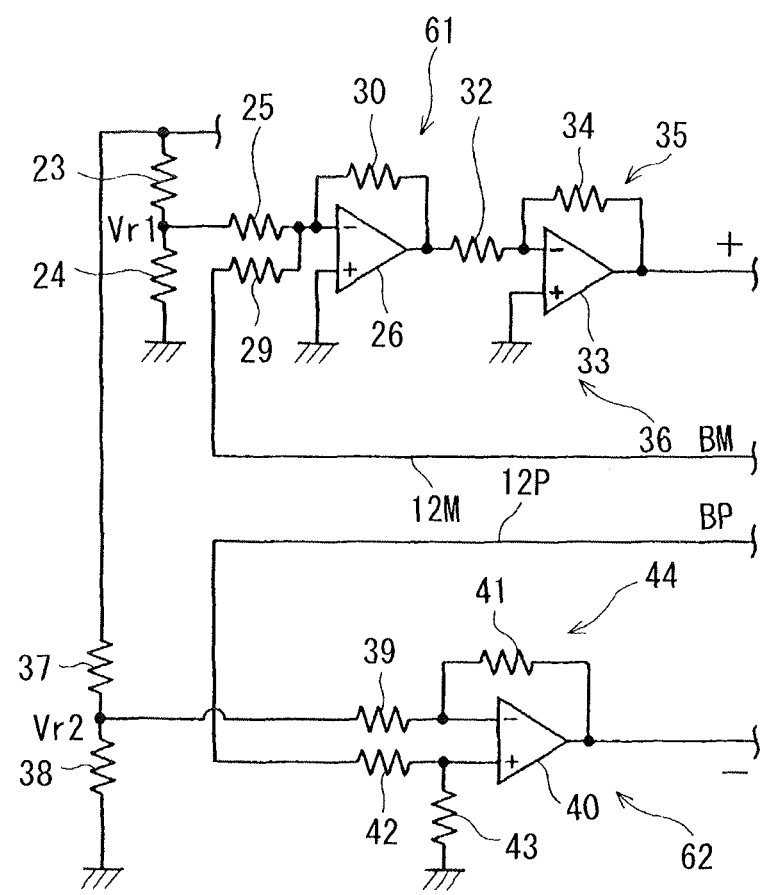
FIG. 10 is a diagram illustrating a ringing suppression circuit according to a fifth embodiment of the present invention.

A fifth embodiment of the present invention is described below with reference to FIG. 10. A difference between the second embodiment and the fifth embodiment that the first potential adjuster circuit 36 and the second potential adjuster circuit 45 are replaced with a first potential adjuster circuit 61 and a second potential adjuster circuit 62, respectively. In the first potential adjuster circuit 36 and the second potential adjuster circuit 45 of the second embodiment, the midpoint potential VM is applied to each of the resistors 29, 42. In the first potential adjuster circuit 61 and the second potential adjuster circuit 62 of the fifth embodiment, the resistor 29 is connected to the signal line 12M, and the resistor 42 is connected to the signal line 12P. In this case, the Vgp applied by the first potential adjuster circuit 61 to the gate of the MOSFET 19 is VBM+Vr1, and the potential Vgm applied by the second potential adjuster circuit 62 to the gate of the MOSFET 20 is Vr2−VBP.

When the potential VBM of the signal line 12M decreases such that Vgp>Vt, the MOSFET 19 is turned on so that the undershoot can be suppressed. When the potential VBP of the signal line 12P increases such that Vgm>−Vt, the MOSFET 20 is turned on so that the undershoot can be suppressed. Thus, how much the undershoot is suppressed can be determined by adjusting a margin of the potential Vr1 of the connection point between the resistors 23, 24 and a margin of the potential Vr2 of the connection point between the resistors 37, 38 with respect to the threshold voltage Vt.

As described above, according to the fifth embodiment, the first potential adjuster circuit 61 generates the potential Vgp applied to the gate of the MOSFET 19 by adding a predetermined potential Vr1 and the potential of the signal line 12M. The second potential adjuster circuit 62 generates the potential Vgm applied to the gate of the MOSFET 20 by subtracting the potential of the signal line 12P from the predetermined potential Vr2. Thus, the undershoot is suppressed according to the differences between the potentials of the signal lines 12M, 12P and the predetermined potentials Vr1, Vr2.

Sixth Embodiment

Figure 11:
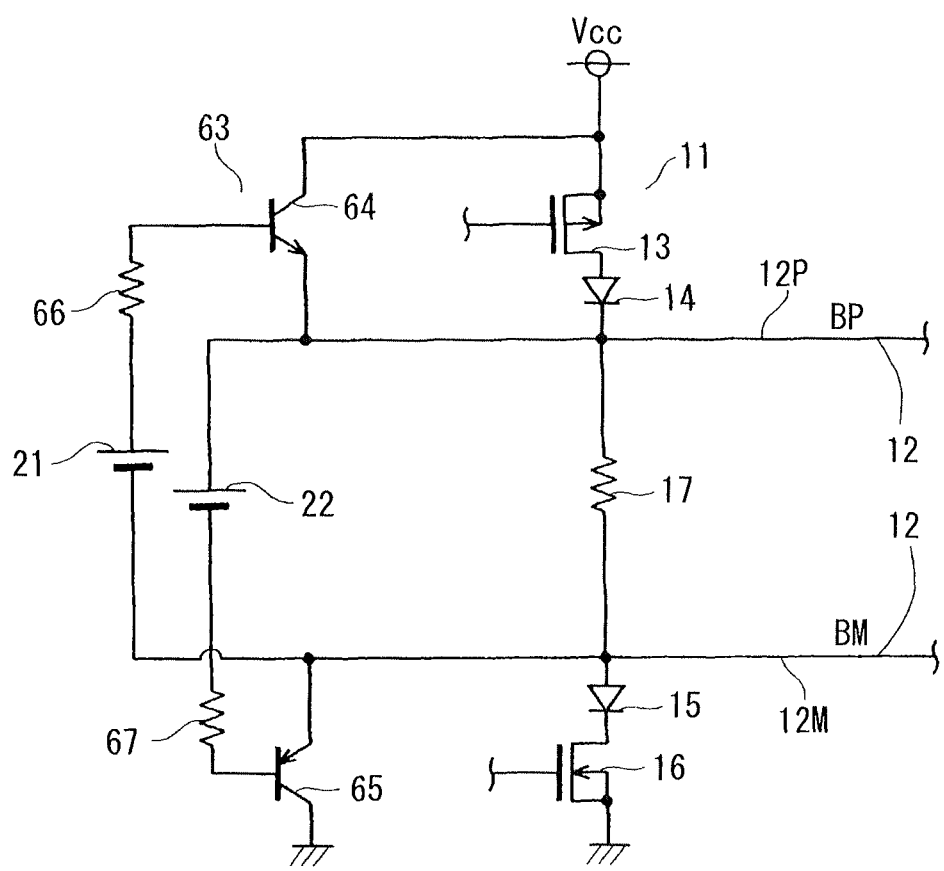
FIG. 11 is a diagram illustrating a ringing suppression circuit according to a sixth embodiment of the present invention.

A ringing suppression circuit 63 according to a sixth embodiment of the present invention is described below with reference to FIG. 11. A difference between the first embodiment and the sixth embodiment is that the N-channel MOSFET 19 and the P-channel MOSFET 20 are replaced with an NPN transistor (as a high potential side switching element) 64 and a PNP transistor (as a low potential side switching element) 65, respectively. A base of the NPN transistor 64 is connected through a resistor 66 to a positive terminal of the first reference voltage source 21. A base of the PNP transistor 65 is connected through a resistor 67 to a positive terminal of the second reference voltage source 22. The reference potential applied by the first reference voltage source 21 to the base of the NPN transistor 64 is equal to a base-emitter voltage VBE of the NPN transistor 64. The reference potential applied by the second reference voltage source 22 to the base of the PNP transistor 65 is equal to a base-emitter voltage VBE of the PNP transistor 65.

Next, advantages of the sixth embodiments are described. As mentioned previously, when both the MOSFET 13 and the MOSFET 16 are turned off, the undershoot is likely to occur. In this case, when the potential VBP of the signal line 12P becomes less than the potential VBM of the signal line VBM (i.e., VBP<VBM), a base current flows to the NPN transistor 64 and the PNP transistor 65 so that the NPN transistor 64 and the PNP transistor 65 can be turned on at the same time. As a result, an electric current path from the signal line 12P to the power supply Vcc is created, and an electric current path from the signal line 12M to the ground is created. Thus, the undershoot is suppressed.

As described above, according to the sixth embodiment, the ringing suppression circuit 63 is constructed with the NPN transistor 64 and the PNP transistor 65. Even in such an approach, the same advantages as the first embodiment can be obtained.

Modifications

Figure 12:
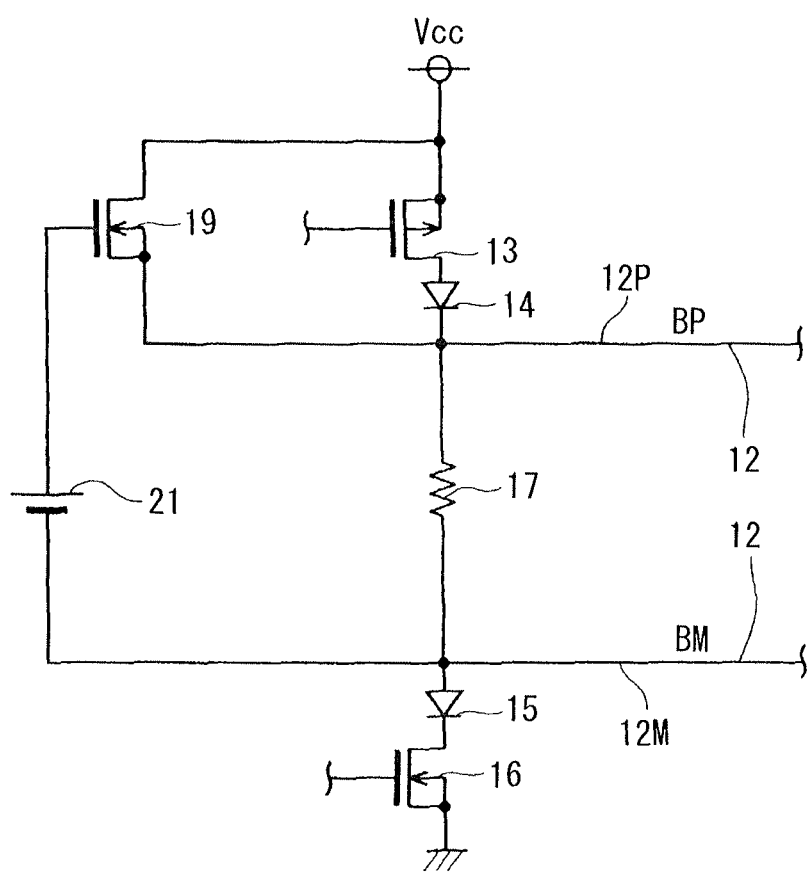
FIG. 12 is a diagram illustrating a ringing suppression circuit according to a modification of the embodiments.

The embodiment described above can be modified in various ways, for example, as follows. The ringing suppression circuit according to the embodiments can be provided to one of the signal lines 12P, 12M of the transmission line 12, for example, as shown in FIG. 12. The reference voltages of the reference voltage sources 21, 22 and the potentials Vr1, Vr2 of the connection points can be adjusted according to the level of the undershoot to be reduced. In the first embodiment, the first reference voltage source 21 can be eliminated so that the gate of the N-channel MOSFET 19 can be connected directly to the signal line 12M, and the second reference voltage source 22 can be eliminated so that the gate of the P-channel MOSFET 20 can be connected directly to the signal line 12P. In such an approach, when a difference in potential between the signal lines 12P, 12M becomes such that VBP+Vt<VBM, the N-channel MOSFET 19 and the P-channel MOSFET can be turned on at the same time. Likewise, in the sixth embodiment, the first reference voltage source 21 can be eliminated so that the base of the NPN transistor 64 can be connected directly to the signal line 12M, and the second reference voltage source 22 can be eliminated so that the base of the PNP transistor 65 can be connected directly to the signal line 12P. In the second to the fifth embodiments, the N-channel MOSFET 19 and the P-channel MOSFET 20 can be replaced with an NPN transistor and a PNP transistor, respectively. In this case, a base resistor is connected to the base of each transistor so that a base current can flow according to a generated potential difference. That is, the first and second potential adjuster circuit can includes the base resistor. The present invention can be applied to a differential signaling protocol other than the CAN protocol. Such changes and modifications are to be understood as being within the scope of the present invention as defined by the appended claims.

What is claimed is:

1. A ringing suppression circuit for a communication circuit that is connected to a transmission line having a pair of high and low potential side signal lines to perform communication by transmitting a differential signal through the transmission line, the ringing suppression circuit comprising:
a high potential side switching element connected between a predetermined high potential reference point and the high potential side signal line;
a low potential side switching element connected between a predetermined low potential reference point and the low potential side signal line; and
a ringing suppression section configured to turn on the high potential side switching element based on a difference between a potential of the high potential side signal line and a potential applied to a control terminal of the high potential side switching element, the ringing suppression section configured to turn on the low potential side switching element based on a difference between a potential of the low potential side signal line and a potential applied to a control terminal of the low potential side switching element, wherein
the ringing suppression section includes a first potential adjuster circuit and a second potential adjuster circuit,
the first potential adjuster circuit is connected between the control terminal of the high potential side switching element and one of the high potential side signal line and the low potential side signal line to adjust the potential applied to the control terminal of the high potential side switching element,
the second potential adjuster circuit is connected between the control terminal of the low potential side switching element and the other of the high potential side signal line and the low potential side signal line to adjust the potential applied to the control terminal of the low potential side switching element,
the first potential adjuster circuit outputs a first voltage to the control terminal of the high potential side switching element by adding the potential of the low potential side signal line and a first predetermined voltage, and
the second potential adjuster circuit outputs a second voltage to the control terminal of the low potential side switching element by subtracting the potential of the high potential side signal line from a second predetermined voltage.

2. The ringing suppression circuit according to claim 1, wherein
each of the first potential adjuster circuit and the second potential adjuster circuit has a bandgap reference circuit.

3. The ringing suppression circuit according to claim 1, wherein
the ringing suppression section includes a first reference potential supply circuit and a second reference potential supply circuit,
the first reference potential supply circuit supplies a first reference potential to the control terminal of the high potential side switching element, the first reference potential being intermediate between a potential of the high potential reference point and a potential of the low potential reference point, and
the second reference potential supply circuit supplies a second reference potential to the control terminal of the low potential side switching element, the second reference potential being intermediate between the potential of the high potential reference point and the potential of the low potential reference point.

4. The ringing suppression circuit according to claim 1, wherein
the high potential side switching element is an NPN transistor having a base as the control terminal, an emitter connected to the high potential reference point, and a collector connected to the high potential side signal line, and
the low potential side switching element is a PNP transistor having a base as the control terminal, an emitter connected to the low potential reference point, and a collector connected to the low potential side signal line.

5. The ringing suppression circuit according to claim 4, wherein
the ringing suppression section includes a first resistor and a second resistor,
the first resistor is connected between the base of the NPN transistor and the low potential side signal line, and the second resistor is connected between the base of the PNP transistor and the high potential side signal line.

6. The ringing suppression circuit according to claim 4, wherein the ringing suppression section includes a first series circuit constructed with a first resistor and a first reference voltage source and a second series circuit constructed with a second resistor and a second reference voltage source, the first series circuit is connected between the base of the NPN transistor and the low potential side signal line, and the second series circuit is connected between the base of the PNP transistor and the high potential side signal line.

7. The ringing suppression circuit according to claim 1, wherein the high potential side switching element is an NPN transistor having a base as the control terminal, an emitter connected to the high potential reference point, and a collector connected to the high potential side signal line, and the low potential side switching element is a PNP transistor having a base as the control terminal, an emitter connected to the low potential reference point, and a collector connected to the low potential side signal line.

8. A ringing suppression circuit for a communication circuit that is connected to a transmission line having a pair of high and low potential side signal lines to perform communication by transmitting a differential signal through the transmission line, the ringing suppression circuit comprising:

a high potential side switching element connected between a predetermined high potential reference point and the high potential side signal line;

a low potential side switching element connected between a predetermined low potential reference point and the low potential side signal line;

a ringing suppression section configured to turn on the high potential side switching element based on a difference between a potential of the high potential side signal line and a potential applied to a control terminal of the high potential side switching element, the ringing suppression section configured to turn on the low potential side switching element based on a difference between a potential of the low potential side signal line and a potential applied to a control terminal of the low potential side switching element; and a midpoint potential detection circuit configured to detect a midpoint potential between the high potential side signal line and the low potential side signal line, wherein the ringing suppression section includes a first potential adjuster circuit and a second potential adjuster circuit, the first potential adjuster circuit is connected between the control terminal of the high potential side switching element and one of the high potential side signal line and the low potential side signal line to adjust the potential applied to the control terminal of the high potential side switching element, the second potential adjuster circuit is connected between the control terminal of the low potential side switching element and the other of the high potential side signal line and the low potential side signal line to adjust the potential applied to the control terminal of the low potential side switching element, the first potential adjuster circuit outputs a first voltage to the control terminal of the high potential side switching element by adding the midpoint potential and a first predetermined voltage, and the second potential adjuster circuit outputs a second voltage to the control terminal of the low potential side switching element by subtracting the midpoint potential from a second predetermined voltage.

* * * * *